(12) United States Patent
Dixon et al.

(10) Patent No.: US 6,594,151 B2
(45) Date of Patent: Jul. 15, 2003

(54) FRAME SUPPORT FOR A PRINTED BOARD ASSEMBLY

(75) Inventors: Scott Dixon, Portland, OR (US); George Hsieh, Portland, OR (US); Terrance J. Dishongh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/004,693

(22) Filed: Dec. 5, 2001

(65) Prior Publication Data
US 2003/0103337 A1 Jun. 5, 2003

(51) Int. Cl.[7] .............................. H05K 5/00; H05K 5/04; H05K 5/06
(52) U.S. Cl. .................. 361/753; 361/760; 361/752; 361/796; 361/803; 361/807; 361/810; 361/761
(58) Field of Search ................ 361/752, 753, 361/707, 704, 703, 710, 711–712, 714, 697, 720, 816, 687, 719, 748, 810, 813, 723, 760–761, 807, 770, 825, 829, 773–774, 724, 758

(56) References Cited

U.S. PATENT DOCUMENTS

| 5,546,275 A | * | 8/1996 | Moutrie et al. | 361/707 |
| 5,586,005 A | * | 12/1996 | Cipolla et al. | 361/719 |
| 6,180,874 B1 | | 1/2001 | Brezina et al. | 174/16.3 |

* cited by examiner

Primary Examiner—David Martin
Assistant Examiner—Thanh Y. Tran
(74) Attorney, Agent, or Firm—Schwegman, Lundberg, Woessner & Kluth, P.A.

(57) ABSTRACT

An assembly includes a substrate with mounting apertures. A frame is disposed through the apertures, optionally in a non-core area of the substrate, where a chassis at least partially encompasses a portion of the substrate. A component is coupled with the frame, and the frame is coupled with the chassis.

28 Claims, 4 Drawing Sheets

FRAME SUPPORT FOR A PRINTED BOARD ASSEMBLY

TECHNICAL FIELD

The present invention relates generally to printed circuit boards and components coupled therewith, and in particular relates to a frame support for supporting components, for example, components that are to be coupled with the printed circuit board.

BACKGROUND

Processors and related computer components are becoming more powerful with increasing capabilities, resulting in increasing amounts of heat dissipated from these components. Simultaneously, package and die sizes of the components are decreasing or remaining the same, which increases the amount of heat energy given off by the component for a given unit of surface area. Furthermore, as computer related equipment becomes more powerful, more chips are surface mounted to the printed circuit board. As an increasing number of components are placed in closer proximity on the printed circuit board, more components are being placed inside the equipment or chassis which is also decreasing in size. Larger amounts of heat are being generated in a smaller volume of space. However, increased temperatures can potentially damage the components of the equipment, or reduce the lifetime of the individual components and the equipment. In addition, some complex components have become more susceptible to damage resulting from stress and strain occurring during testing, packaging, and use of the printed circuit board.

Heat sinks have been used to dissipate heat from the processor and other heat producing components within a housing. However, the overall size of the heat sink is limited by the volume constraints of the housing, and the footprint of the and/or the size constraints. Heat dissipation has been increased by using clips which physically hold a heat sink to the processor package. For some heat sinks, a spring force is used in coupling the heat sink with the heat producing component to maximize the amount of heat dissipated from the heat producing components. However, when assembling the heat sink with the heat producing component, the assembly of the spring clip causes the printed board to flex adjacent to the heat producing component, resulting in stress to the solder balls or connection between the chips and the printed circuit boards. In addition, rigorous handling processes, such as shipping and/or testing place additional stresses on the circuit board and/or the components, increasing the risk of failure to the structurally weak solder balls.

FIG. 1 illustrates another conventional manner in which heat sink assemblies 50 are coupled with heat producing components. A retention mechanism 52 is coupled to a lower portion 54 of the heat sink assembly 50. The retention mechanism 52 is disposed through mounting holes 56 directly adjacent to the heat sink assembly 52 and the heat producing component, which causes stress to the solder balls or connection between the chips and the printed circuit board 58.

Accordingly, there is a need for a way to cool components without increasing the risk of damage to a substrate. What is also needed is a way to minimize stress and damage to the connections between components and the printed circuit boards.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
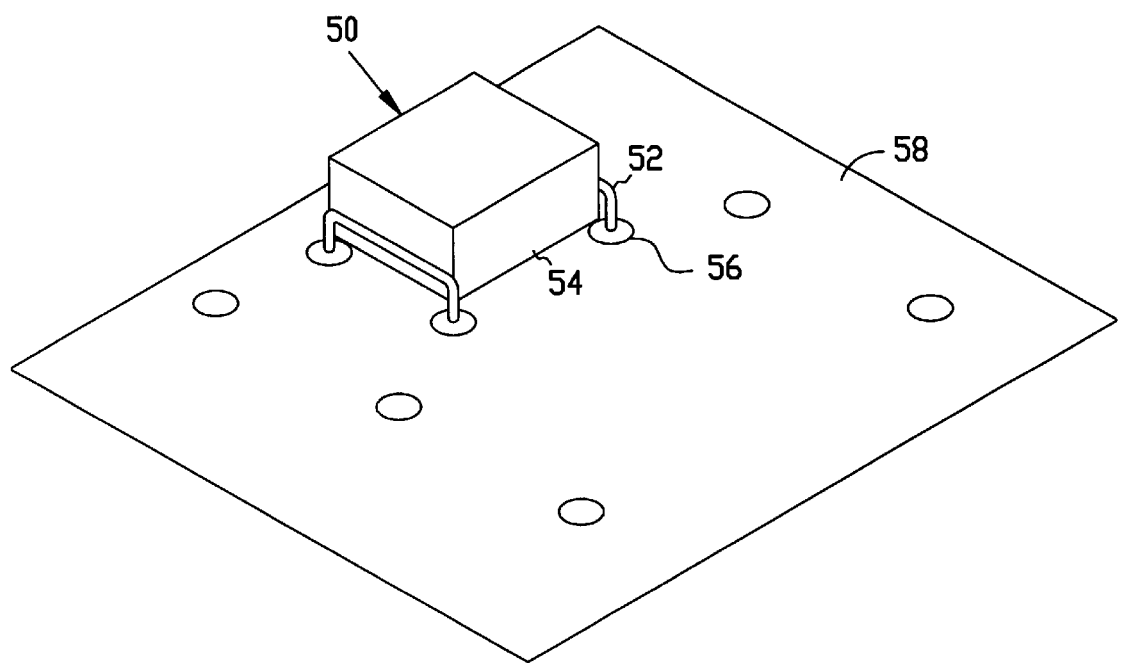
FIG. 1   illustrates a prior art heat sink attachment assembly.
Figure 2:
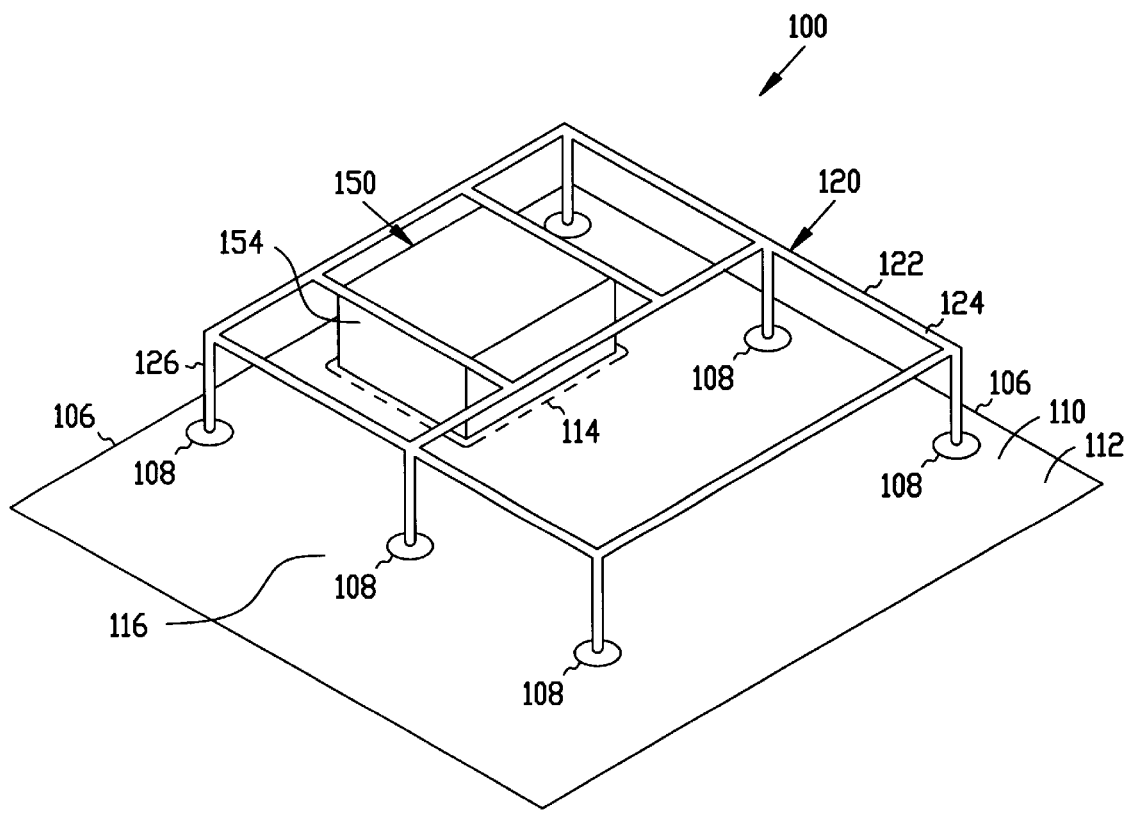
FIG. 2   illustrates a perspective view of an assembly constructed in accordance with one embodiment.

An assembly 100 is generally shown in FIG. 2. The assembly 100 includes a substrate 110, such as a printed circuit board 112 or a motherboard, a frame 120, and at least one component 150, such as a heat sink. The frame 120 mechanically supports the at least one component 150 above the substrate 110 and assists in preventing movement of the component 150 relative to the substrate 110, and further assists in preventing the component from placing excessive or harmful force on the printed circuit board 112 in a core area, as further discussed below.

The substrate 110 includes a core area 114 and a non-core area 116. The core area 114 of the substrate 110 relates to an area in which critical, sensitive and/or fragile heat producing components, such as a processor, are mechanically and/or electrically mounted on the substrate 110. The core area 114 further relates to an area where electrical routing is dense. The printed circuit board 112 further includes a non-core area 116, which lies outside of the core area 114. One example of a non-core area 116 is the outer perimeter of the substrate 110, or outer edges of the substrate.

The substrate 110 further includes one or more mounting apertures 108 therein. One or more of the mounting apertures 108 are disposed in a non-core area 116 of the substrate 110, where the one or more mounting apertures 108 fall outside of the core area 114. For example, one or more of the mounting apertures 108 are disposed near outer edges 106 of the substrate 110 in the non-core area 116. As mentioned above, the component 150 is electrically mounted in a core area 114 of the substrate 110.

Figure 3:
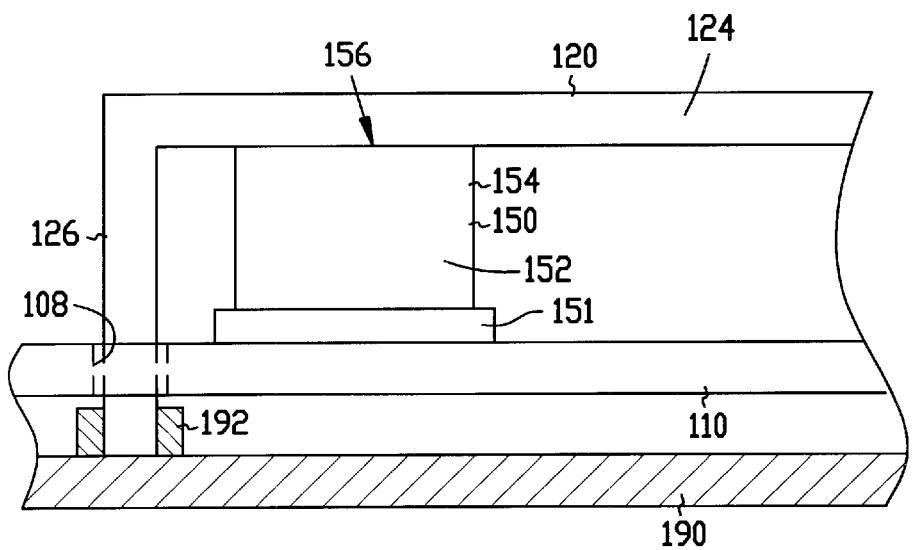
FIG. 3   illustrates a cross-sectional view of an assembly constructed in accordance with one embodiment.

Referring to FIG. 3, the component 150 comprises, in one option, a thermal solution such as a heat sink. Other components suitable for use with the frame 120 include, but are not limited to, fans, water cooling units, phase change salt units, vapor chambers, heat pipes, and air ducts. The component 150, in one option, is electrically and/or mechanically coupled directly with the substrate 110 or printed circuit board 112. In another option, a heat producing component 151, such as a processor, is disposed between the component 150 and the substrate 110, where the component 150 is disposed over the heat producing component 151. The heat producing component 151 is thermally coupled with the component 150, and mechanically coupled with the substrate 110. The component 150, in one option, dissipates heat from the heat producing component 151. As mentioned above, the component 150 is mechanically coupled with the frame 120.

The frame 120 is formed as a rigid, or substantially rigid component, for example, using rigid material or coupling the frame 120 with rigid material. Suitable materials for the frame 120 include, but are not limited to, plastic, ceramic, etc. Other options for incorporating rigidity into the frame 120 include forming at least a portion of the frame 120 of rigid material, or incorporating structure into the frame 120 to improve rigidity. Constructing the frame 120 in a rigid and/or substantially rigid manner, and attaching the frame 120 to the chassis minimizes damage resulting from energy transferred from the component 150 to the substrate 110, for example, during shipping and handling, or exposure to shock and vibration. Furthermore, the frame 120 transfers energy from the component 150 through non-sensitive areas of the substrate 110, and to the chassis 190. In addition, the frame 120 absorbs energy from displacement of the component 150, which would otherwise cause damage to sensitive areas of the substrate 110.

Figure 5:
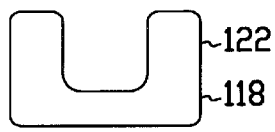
FIG. 5   illustrates a cross-sectional view of a frame constructed in accordance with one embodiment.

Referring to FIGS. 2 and 5, the frame 120 includes a plurality of members 122, for example, horizontal members 124 and vertical members 126. One or more of the plurality of members 122 have a U-shaped cross-section 118, as shown in FIG. 5. This allows for the frame to be made lightweight, yet maintain its strength. It should be noted that the horizontal members 124 and/or vertical members 126 can be formed separately and coupled together, for example, by welding, or formed as a single unit. Further options for forming the frame 120 include, but are not limited to, molding or stamping.

Figure 4:
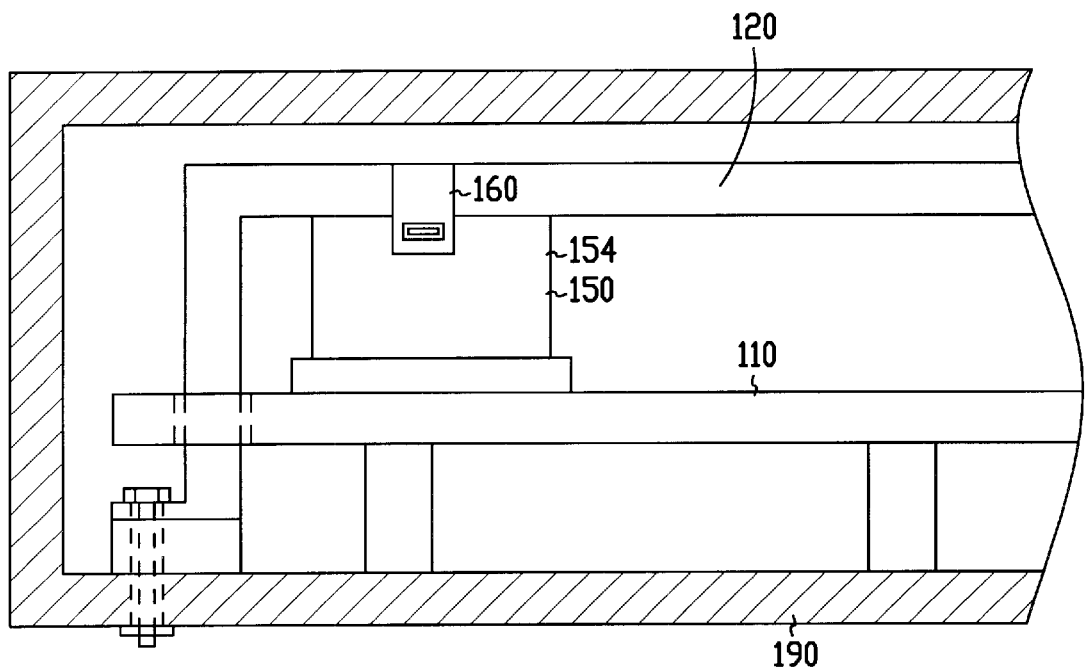
FIG. 4   illustrates a cross-sectional view of an assembly constructed in accordance with one embodiment.

Referring again to FIG. 3, the vertical members 126 are disposed through the mounting apertures 108 of the substrate 110, optionally disposed through a stand-off 192, and are coupled directly with the chassis 190. It should be noted that the frame 120 can be coupled directly or indirectly with the chassis 190. In one option, the frame 120 is threadingly coupled with the chassis 190, as shown in FIG. 4. In another option, the frame 120 is coupled with the chassis 190 with a snap-fit coupling, as shown in FIG. 3.

Referring again to FIG. 2, in one option, the vertical members 126 are disposed through mounting apertures 108 in a non-core area 114 of the substrate 110. When assembled, the horizontal members 124 sit on or above the substrate 110. At least one component 150 is mechanically coupled with the frame 120, for example, to the horizontal members 124. In one option, a top portion 154 of the component 150 is coupled with the frame 120, as shown in FIGS. 3 and 4. By coupling the frame 120 with a top portion 154 of the component 150, the frame 120 can be used to exert force on the component 150, for example, exerting force on a heat sink to achieve improved thermal dissipation at the interface between the heat sink and the heat source. In another option, a top surface 156 of the component 150 is coupled with the frame 120. One manner in which the component 150 is coupled with the frame 120 is with a fastener 160, as shown in FIG. 4.

A fastener 160 is disposed over a portion of the frame 120, and is coupled with a portion of the component 150. In one example, the fastener 160 comprises a spring, which is coupled over tabs of a heat sink. The tabs are formed of sufficient structure and/or rigidity to support the force of the spring, without damage to the frame 120. It should be noted that other mounting features other than tabs are suitable as well, for example, recesses disposed within the frame 120 or other suitable fasteners.

Referring again to FIG. 3, the component 150 is coupled with the frame 120, and the frame 120 is coupled directly with the chassis 190 through a non-core area 116 of the substrate 110, energy from the component 150 is transferred into the frame 120 at an area that is away from sensitive areas of the substrate 110. It should be noted that the frame 120 can be coupled directly or indirectly with the chassis 190. In addition, mounting apertures can be removed from the core area 114 of the substrate 110, resulting in additional area on the substrate 110 for other components or for routing electrical traces. The frame 120 is disposed through the printed circuit board 112, and is coupled with a chassis 190, or alternatively coupled directly to sub-structures. The chassis 190 at least partially encompasses a portion of the substrate 110. For instance, the chassis 190 is disposed adjacent to one side or a portion of one side of the substrate 110.

As the frame 120 is disposed through one or more apertures 108 in a non- core area 114 of the substrate 110, valuable real estate on the substrate 110 is conserved. It should be noted that other or alternative mounting holes can also be eliminated to provide for additional real estate on the printed circuit board 112. Insertion of the frame 120 through mounting apertures 108 that are in a non-core area of the substrate 110 allows for a distribution of force over a larger area, and reducing stress placed on the substrate 110. Furthermore, the frame 120 provides a stable attachment to retain the component 150.

Figure 6:
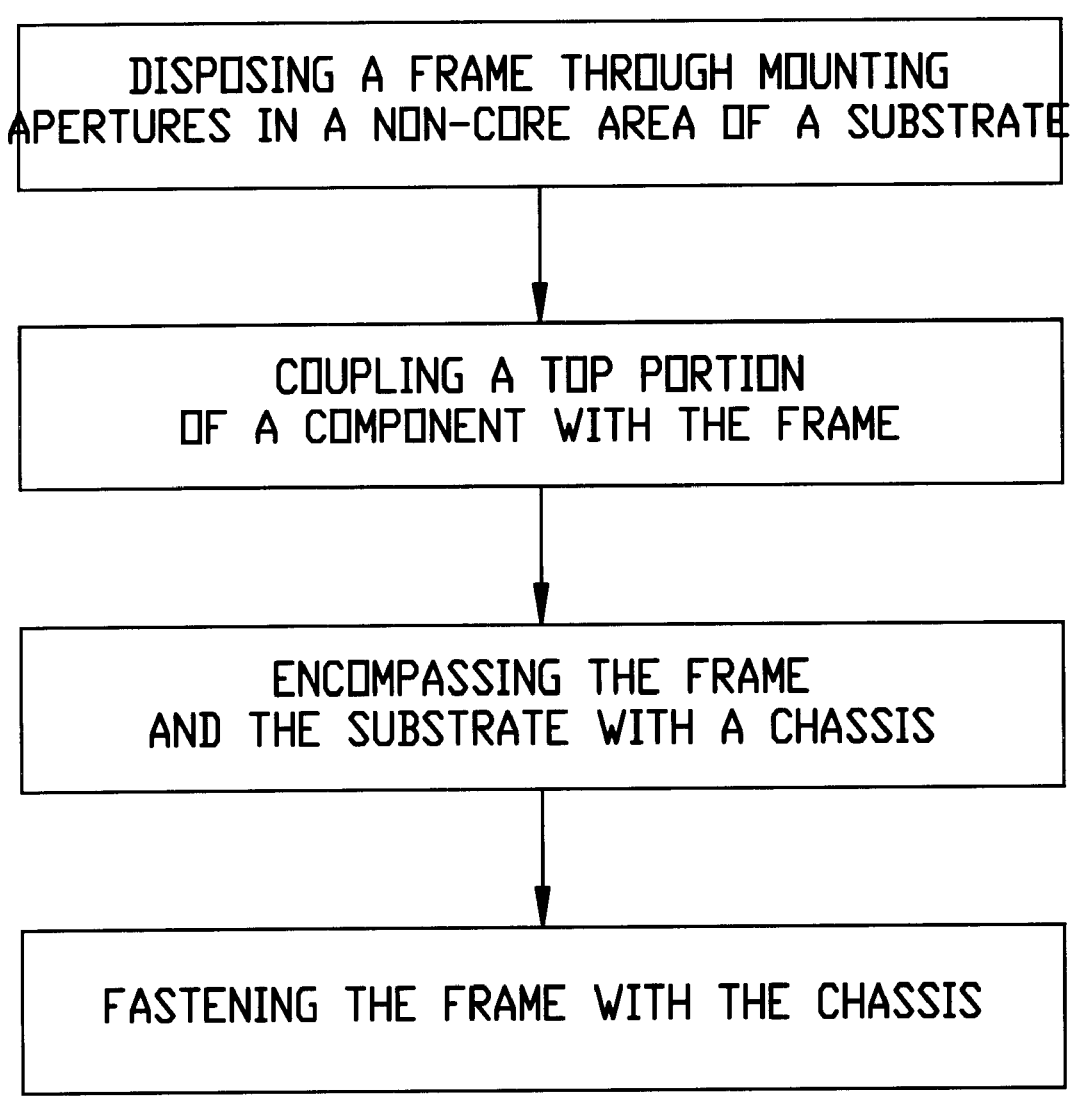
FIG. 6   illustrates a block diagram of a method in accordance with one embodiment.

A method for manufacturing a heat sink apparatus and/or cooling a heat producing component is described herein, where a block diagram of the method is shown at FIG. 6. The method includes disposing a frame having vertical members through mounting apertures in a non-core area of a printed circuit board. The core area of the printed circuit board relates to an area in which sensitive and/or fragile components, such as a processor, are mounted on the printed circuit board. The core area further relates to an area where electrical routing is dense. The printed circuit board further includes a non-core area, which is outside of the core area. The method further includes mechanically coupling the frame with a chassis, the chassis at least partially encompassing the frame and the printed circuit board, and mechanically coupling a component with the frame over the printed circuit board, where the mounting apertures are not directly adjacent to the component.

Several options for the method are as follows. For instance, in one option, mechanically coupling the frame with a chassis includes mechanically coupling the frame directly with the chassis. For instance, in one option, the method further includes coupling a heat producing component between the component and the printed circuit board, and thermally coupling the component and the heat producing component. In another option, coupling the frame with the chassis includes threadingly coupling the frame with the chassis, for example directly with the chassis, or coupling the frame with the chassis with a snap fit connection. In yet another option, coupling the component with the frame includes coupling a top surface of the component with the frame. The method optionally further comprises disposing a fastener over one or more horizontal members of the frame, and optionally with a portion of the component. The fastener couples the component to the frame, for example, by spring force or interference fit.

In another embodiment, the method includes disposing a frame having vertical members through mounting apertures of a printed circuit board, mechanically coupling the frame with a chassis, where the chassis at least partially encompasses the frame and the printed circuit board. The method further includes coupling a component with the frame, and disposing a fastener over a portion of the frame, and coupling the fastener with a top portion of the component.

Several options for the method are as follows. For instance, in one option, disposing a frame having vertical members through mounting apertures of a printed circuit board includes disposing the vertical members through mounting apertures in a non-core area of the printed circuit board. In another option, coupling the frame with the chassis includes threadingly coupling the frame with the chassis or coupling the frame with the chassis with a snap fit connection. This allows for the frame to be more easily and cost effectively assembly to the chassis. In another option, the method further includes coupling a heat producing component between the component and the printed circuit board, and thermally coupling the component and the heat producing component. In yet another option, the frame includes horizontal members, and disposing a fastener over a portion of the frame, and coupling the fastener with a portion of the first component includes coupling with first component only with horizontal members of the frame. The method, in one option, further includes mechanically coupling the frame directly with the chassis.

The method reduces the number of assembly steps, allowing for a faster, more cost efficient assembly. In addition, coupling the component with a top portion of the component, horizontal members of the frame, and/or having the frame disposed through mounting apertures distal to the component assists in preventing stress on the core area of the printed circuit board.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An assembly comprising:
    a substrate having one or more mounting apertures therein;
    at least one frame disposed through the substrate and through the one or more apertures;
    a chassis at least partially encompassing at least a portion of the substrate;
    the frame mechanically coupled with the chassis;
    at least one component coupled with the frame, the frame mechanically coupled with a top portion of the component, and the component mechanically supported by the frame above the substrate; and
    wherein the frame includes horizontal members disposed above the substrate, and the at least one component is disposed between the horizontal members and the substrate.

2. The assembly as recited in claim 1, wherein the frame is mechanically coupled directly with the chassis.

3. The assembly as recited in claim 1, further comprising a heat producing component disposed between the at least one component and the substrate, the heat producing component electrically coupled with the substrate, and the at least one component is thermally coupled with the heat producing component.

4. The assembly as recited in claim 1, wherein the frame is mechanically coupled with the chassis with a snap-fit coupling.

5. The assembly as recited in claim 1, wherein the frame is mechanically coupled with a top surface of the component.

6. The assembly as recited in claim 1, wherein the vertical members are disposed through the substrate without mechanically coupling to the substrate.

7. The assembly as recited in claim 1, wherein the mounting apertures are disposed distal to the at least one component in a non-core area of the substrate.

8. The assembly as recited in claim 7, wherein one or more of the mounting apertures are located directly adjacent to an outer perimeter of the substrate.

9. An assembly comprising:
    a substrate having a substantially planar surface and outer edges, the substrate having one or more mounting apertures therein, one or more of the mounting apertures disposed directly adjacent to the outer edges of the substrate;
    at least one frame disposed through the one or more mounting apertures;
    at least one component mechanically coupled with the at least one frame;
    at least one heat producing component disposed between the at least one component and the substrate, the at least one component thermally coupled with the at least one heat producing component;
    a chassis at least partially encompassing the substrate and the frame; and
    the frame including horizontal and vertical members, the vertical members of the frame mechanically coupled to the chassis through mounting apertures of the substrate.

10. The assembly as recited in claim 9, wherein the at least one frame has a U-shaped cross-section.

11. The assembly as recited in claim 9, further comprising a means for fastening the frame with the chassis.

12. The assembly as recited in claim 9, wherein at least one of the horizontal members is coupled with a top portion of the component.

13. The assembly as recited in claim 12, wherein the component is not coupled with the vertical members of the frame.

14. The assembly as recited in claim 13, wherein a fastener is disposed over the horizontal members and coupled with the component.

15. The assembly as recited in claim 9, wherein the vertical members of the frame are disposed through a non-core area of the substrate, and the at least one component is disposed over a core area of the substrate.

16. The assembly as recited in claim 9, wherein the frame is mechanically coupled directly with the chassis.

17. A method comprising:
    disposing a frame having vertical members through mounting apertures in a non-core area of a printed circuit board;
    mechanically coupling the frame with a chassis, the chassis at least partially encompassing the frame and the printed circuit board; and mechanically coupling a component with horizontal members of the frame such that the component is disposed between the horizontal members of the frame and the printed circuit board.

18. The method as recited in claim 17, wherein mechanically coupling the frame with a chassis includes mechanically coupling the frame directly with the chassis.

19. The method as recited in claim 17, further comprising coupling a heat producing component between the component and the printed circuit board, and thermally coupling the component and the heat producing component.

20. The method as recited in claim 17, wherein coupling the frame with the chassis includes threadingly coupling the frame directly with the chassis.

21. The method as recited in claim 17, wherein coupling the frame with the chassis includes coupling the frame with the chassis with a snap fit connection.

22. The method as recited in claim 17, further comprising disposing a fastener over at least one of the horizontal members of the frame, and coupling the fastener with a portion of the component.

23. A method comprising:

disposing a frame having vertical members through mounting apertures of a printed circuit board; and mechanically coupling the frame with a chassis such that a heat sink is disposed between horizontal members of the frame and the printed circuit board, the chassis at least partially encompassing the frame and the printed circuit board.

24. The method as recited in claim 23, wherein disposing a frame having vertical members through mounting apertures of a printed circuit board includes disposing the vertical members through mounting apertures in a non-core area of the printed circuit board.

25. The method as recited in claim 23, wherein coupling the frame with the chassis includes coupling the frame with the chassis with a snap fit connection.

26. The method as recited in claim 23, further comprising coupling a fastener with a portion of the horizontal members of the frame to secure the heat sink to the frame.

27. The method as recited in claim 23, further comprising coupling a heat producing component between the heat sink and the printed circuit board.

28. The method as recited in claim 23, wherein mechanically coupling the frame with the chassis includes mechanically coupling the frame directly with the chassis.

* * * * *